(12) United States Patent
Lundgren et al.

(10) Patent No.: US 11,212,043 B2
(45) Date of Patent: Dec. 28, 2021

(54) HIGH RATE RECEIVER CIRCUIT

(71) Applicant: HUAWEI TECHNOLOGIES CO., LTD., Guangdong (CN)

(72) Inventors: Thomas Lundgren, Kista (SE); Bengt Lindoff, Kista (SE)

(73) Assignee: HUAWEI TECHNOLOGIES CO., LTD., Guangdong (CN)

( * ) Notice: Subject to any disclaimer, the term of this patent is extended or adjusted under 35 U.S.C. 154(b) by 98 days.

(21) Appl. No.: 16/824,353

(22) Filed: Mar. 19, 2020

(65) Prior Publication Data

US 2020/0220667 A1 Jul. 9, 2020

Related U.S. Application Data

(63) Continuation of application No. PCT/EP2017/073984, filed on Sep. 22, 2017.

(51) Int. Cl.
*H04L 1/18* (2006.01)
*H04B 1/16* (2006.01)
*H04L 1/00* (2006.01)

(52) U.S. Cl.
CPC ............ *H04L 1/1835* (2013.01); *H04B 1/16* (2013.01); *H04L 1/0047* (2013.01); *H04L 1/0061* (2013.01); *H04L 1/1812* (2013.01)

(58) Field of Classification Search
CPC ... H04L 1/1835; H04L 1/0045; H04L 1/0069; H04L 1/08; H04L 1/1812; H04L 1/1614; H04L 5/001; H04L 1/1819; H04L 5/00; H04L 1/0061; H04L 1/1854; H04L 5/0055; H04L 1/0041; H04L 1/00; H04L 1/0052; H04L 1/0057; H04L 1/0058; H04L 27/20;
(Continued)

(56) References Cited

U.S. PATENT DOCUMENTS

2008/0222498 A1   9/2008  Shieh et al.
2008/0320375 A1*  12/2008  Hori ...................... H04L 1/0061
                                                                714/807
(Continued)

FOREIGN PATENT DOCUMENTS

CN        1988521 A      6/2007
CN      101527849 A      9/2009
(Continued)

*Primary Examiner* — Hardikkumar D Patel
(74) *Attorney, Agent, or Firm* — Womble Bond Dickinson (US) LLP

(57) ABSTRACT

The application relates to methods and devices for use in a receiver circuit (200) configured to receive data in transport blocks where each transport block comprises a set of individually decodable code blocks is provided. The receiver circuit comprises a decoder (102) for decoding the received data and at least one on-chip FIFO memory (210). The receiver circuit also comprises a Layer 2 decipher unit (104), and a buffer memory (106). In the receiver circuit, a controller (220) is provided. The decoder is configured to store a correctly decoded code block in the at least one on-chip FIFO memory, and when a code block of a transport block is incorrectly decoded, store any subsequent correctly decoded code block of the same transport block in the buffer memory. Hereby an efficient receiver circuit that can be implemented using a small on-chip memory is provided.

11 Claims, 7 Drawing Sheets

(58) Field of Classification Search
CPC ......... H04L 1/005; H04L 1/0047; H04L 9/00;
H04L 2209/80; H04L 2209/12; H04B
1/16; G09C 1/00; H04W 76/27; H04W
12/03; H03M 13/1105; H03M 13/09;
H03M 13/114; H03M 13/1148; H03M
13/1128; H03M 13/1188; H03M 13/6575;
H03M 13/116; H03M 13/155; H03M
13/6325; H03M 13/618; H03M 13/1131;
H03M 13/6362; H03M 13/1515; H03M
13/6356; H03M 13/2785; H03M 13/2707
See application file for complete search history.

(56) References Cited

U.S. PATENT DOCUMENTS

| | | | |
|---|---|---|---|
| 2010/0303237 A1* | 12/2010 | Park | ............................. H04L 9/00 |
| | | | 380/270 |
| 2011/0211660 A1* | 9/2011 | Kelin | ................. H03M 13/3738 |
| | | | 375/341 |
| 2013/0151920 A1 | 6/2013 | Mayrench et al. | |
| 2014/0281843 A1 | 9/2014 | Lo et al. | |
| 2016/0241362 A1 | 8/2016 | El-Khamy et al. | |

FOREIGN PATENT DOCUMENTS

| | | |
|---|---|---|
| CN | 101667887 A | 3/2010 |
| CN | 101800554 A | 8/2010 |
| CN | 101983489 A | 3/2011 |
| CN | 102594504 A | 7/2012 |
| CN | 104715787 A | 6/2015 |
| EP | 2269338 A2 | 1/2011 |
| WO | 2012149741 A1 | 11/2012 |

\* cited by examiner

HIGH RATE RECEIVER CIRCUIT

CROSS-REFERENCE TO RELATED APPLICATIONS

This application is a continuation of International Application No. PCT/EP2017/073984, filed on Sep. 22, 2017, the disclosure of which is hereby incorporated by reference in its entirety.

TECHNICAL FIELD

The application relates to methods and devices for a receiver circuit. In particular the application relates to methods and devices for a receiver circuit designed for high data rates.

BACKGROUND

The 3GPP standard for new radio (NR), also referred to as 5G, aims at providing user data rates at about 20 Gbit/s. When data is received by a mobile device, such as a user equipment or a client device, it is processed by several functions after each other and also in parallel. A conventional way to implement this processing is to let these functions read the input data from a memory and to write the output data after processing to a memory. A common system design for this system is to have one common memory that several functions can read the input from and write the output to.

FIG. 1 depicts a conventional interface between the physical layer in a receiver circuit 100, often referred to as layer 1, and Layer 2 (L2) of the OSI model, when used for a 5G implementation. The output from the physical layer is received from a channel decoder function 102, termed decoder herein. The function that handles the main part of data in L2 is the decryption function 104, termed decipher unit herein. In FIG. 1 each arrow 110, 112, 114 and 116 to/from a system memory 106 represents the data rate in the system over the interface 120. Deciphered data can be read by an application 108 from the system memory 106.

There is a constant desire to improve the performance for receiver circuits. In particular, there is a need to provide a receiver circuit that is suitable for new radio in 5G systems.

SUMMARY

It is an object of the present application to provide an improved receiver circuit. In particular it is an object of the present application to provide an improved receiver that can cope with requirements of new radio transmission methods such as 3GPP new radio (NR).

This object and/or others are obtained by the methods and devices as set out in the appended claims.

As has been realized by the inventors, one problem with the conventional approach for receiver circuits is that the interface to the common memory from which data is read from and written to becomes a bottleneck when the data rate is increased. Consider for example the embodiment in FIG. 1. Here, the data rate on the common interface would yield 80 Gbit/s when the received data rate approaches 20 Gbit/s, which is typically not feasible with existing techniques.

In accordance with the application, a receiver circuit configured to receive data in transport blocks where each transport block comprises a set of individually decodable code blocks is provided. The receiver circuit comprises a decoder for decoding the received data and at least one on-chip First in First out (FIFO) memory. The receiver circuit also comprises a Layer 2 decipher unit, and a buffer memory. In the receiver circuit, a controller is provided. The controller may be configured to co-ordinate reception of data by the decoder and deciphering by the Layer 2 decipher unit. The decoder is configured to store a correctly decoded code block in the at least one on-chip FIFO memory, and when a code block of a transport block is incorrectly decoded, store any subsequent correctly decoded code block of the same transport block in the buffer memory. The Layer 2 decipher unit is configured to in a sequential deciphering process sequentially and in a consecutive order receive decoded code blocks from the at least one on-chip FIFO memory and decipher correctly decoded code blocks, and when it is indicated to the Layer 2 decipher unit that a code block has been incorrectly decoded stop the sequential deciphering process, and when the controller indicates to the Layer 2 decipher unit that a previously incorrectly decoded code block later has been correctly decoded by the decoder, continue the sequential deciphering process by deciphering the previously incorrectly decoded code block and by retrieving any code blocks of the same transport block stored in the buffer memory transferred via the on-chip FIFO memory for sequentially deciphering said retrieved code blocks in a consecutive order. The indication to the Layer 2 decipher unit about the status in the on-chip FIFO memory could be direct and handled by the controller, but could also be indirect such as the Layer 2 decipher unit detecting that the FIFO memory is running low on data or some other mechanisms controlling the flow can be used. All such mechanisms both direct and indirect mechanisms are considered to be covered by the term "controller". Hereby an efficient receiver circuit that can be implemented using a small on-chip memory. This can be obtained by providing a processing mechanism for a received transport block on code block level, whereby the size of an on-chip memory can be reduced compared to other solutions.

In accordance with a first embodiment, the decoder is configured to move correctly decoded blocks of a transport block to the on-chip FIFO memory as long as all previous code blocks from the transport block are correctly decoded. Hereby, it is enabled to provide a deciphering of a code block as soon as it is correctly decoded. There is no need for decoding an entire transport block before starting the deciphering process.

In accordance with a second embodiment, the receiver circuit is configured to receive the code blocks in a consecutive order. Hereby, the receiver circuit can be made efficient for receiving transmission where the data is transmitted in code blocks ordered in consecutive order, i.e. without interleaving. For example, transmission over the air-interface in new radio (NR) can be used.

In accordance with a third embodiment, the receiver circuit is configured to request re-transmission of an incorrectly decoded code block using a HARQ process. Hereby, an efficient re-transmission procedure for incorrectly decoded code blocks can be implemented.

In accordance with a fourth embodiment, the buffer memory is an off-chip memory. Hereby, the on-chip memory can be kept small and cost efficient.

In accordance with a fifth embodiment, multiple on-chip FIFO memories are provided and different parallel received transport blocks are associated with a separate on-chip FIFO memory. Hereby, multiple parallel HARQ processes can be used. Thus, when multiple on-chip FIFO memories are provided, several transport blocks can be received in parallel. One on-chip FIFO memory can then be associated with a particular transport block such that all code blocks of one transport block are placed in the same on-chip FIFO memory.

In accordance with a sixth embodiment, a configurable number of on-chip FIFO memories are provided. Hereby, the receiver circuit can be adapted to match the transmission scheme used.

In accordance with a seventh embodiment, the decipher unit is configured to store a deciphered version of a transport block in a system memory of the receiver circuit when all code blocks of the transport block have been deciphered. Hereby, the transport block can be stored in a memory for use by an application.

In accordance with an eighth embodiment, the buffer memory is a part of the system memory. Hereby, the system memory can be used as a buffer memory and no separate buffer memory is required.

In accordance with a ninth embodiment, the Layer 2 decipher unit is configured to continue deciphering code blocks associated with another HARQ process while waiting for the incorrectly decoded code block to be correctly decoded. Hereby, an efficient decipher process is achieved when multiple parallel HARQ processes exist where the deciphering can continue for HARQ processes where correctly decoded code blocks are available for deciphering. The deciphering process is then made more efficient since there is no or at least less time spent in an idle state waiting for new code blocks to be deciphered.

The application in further aspects provide methods and computer program products that can be used in the devices set out above. Features described in conjunction with an apparatus can likewise be applied to mentioned methods and computer program products.

BRIEF DESCRIPTION OF THE DRAWINGS

The application will now be described in more detail, by way of example, and with reference to the accompanying drawings, in which.

DETAILED DESCRIPTION

The application will now be described in detail hereinafter with reference to the accompanying drawings, in which certain embodiments of the application are shown. The application may, however, be embodied in many different forms and should not be construed as limited to the embodiments set forth herein; rather, these embodiments are provided by way of example so that this disclosure will be thorough and complete, and will fully convey the scope of the application to those skilled in the art. Like numbers refer to like elements throughout the description.

Figure 1:
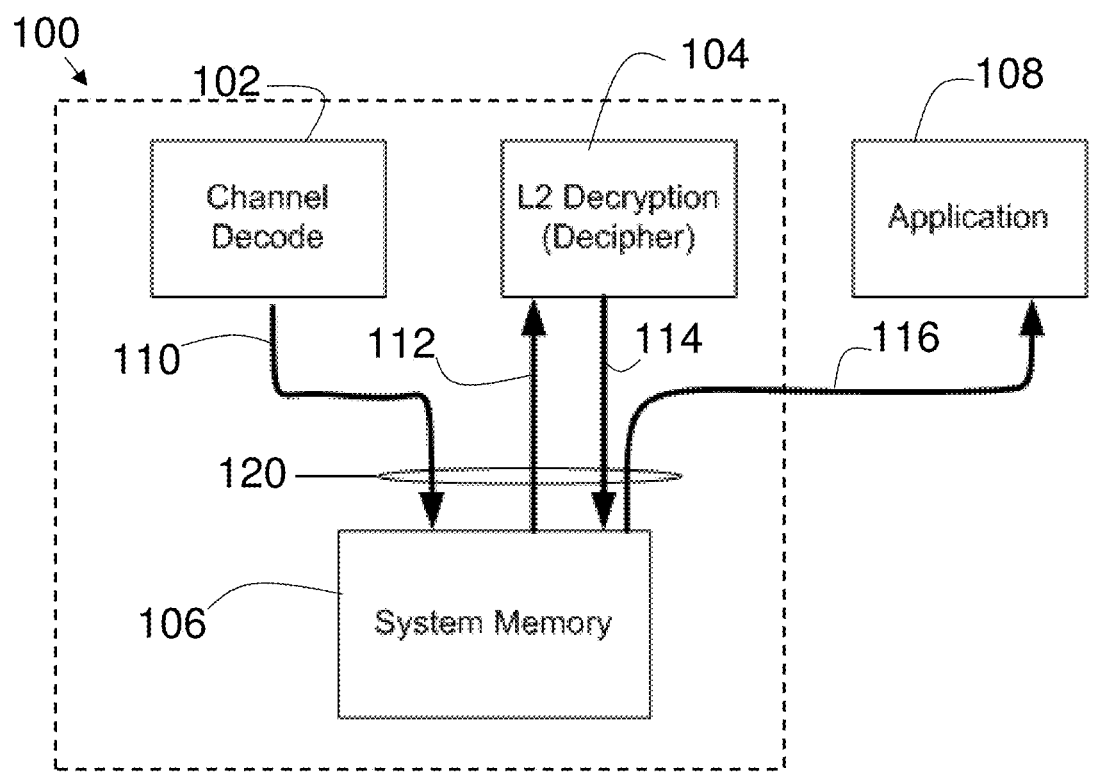
FIG. 1 shows a conventional receiver circuit structure.

In FIG. 1, a conventional interface between the physical layer in a receiver circuit, often referred to as layer 1 (L1), and data link Layer 2 (L2) of the OSI model, when used for a 5G embodiment, is shown. As set out above it is envisaged that the load on the memory bus can become too high when the data rate is increased and reaches several Gbit/s or even higher rates.

Figure 2:
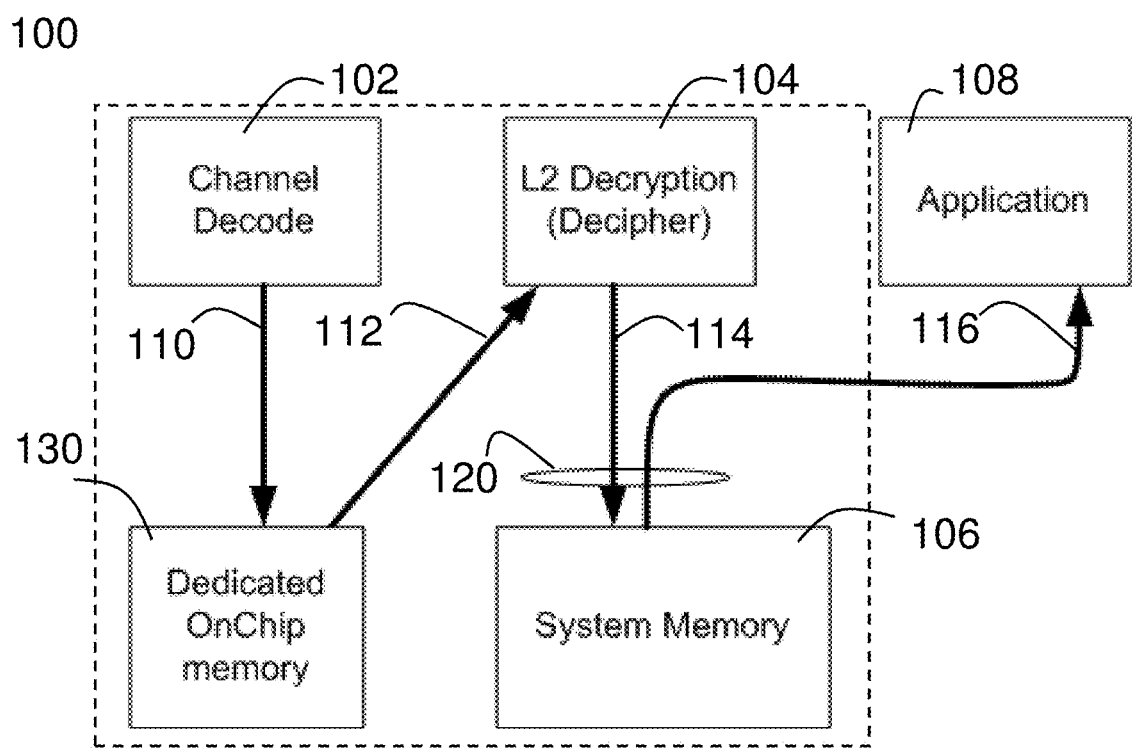
FIG. 2 shows a possible variant of a receiver circuit structure.

One way to handle the problem with the high load on the memory bus 120 in the embodiment in FIG. 1, could be to use dedicated memories between different functions. As an example, FIG. 2 shows a system 100 that uses a dedicated memory 130 between the physical layer (Channel Decode/decoder) 102 and the Layer 2 (Decryption/decipher unit) 104. In the embodiment shown in FIG. 2, the load on the memory bus 120 to the System Memory 106 is half compared to the system in FIG. 1. Transport blocks (TBs) are delivered from the physical layer to Layer 2. TBs are received over a time unit up to 1 ms. For high rate embodiments, a Transmission Time Interval (TTI) of 0.5 ms can be used. For 20 Gbit/s over a TTI of 0.5 ms, the total amount of user data bits is about 10 Mbit. It is normal to use double buffering to allow production of new data at the same time as the current data is consumed. Thus, the dedicated memory then would need to be in the order of 20 Mbit for 0.5 ms TTI. If 1 ms TTI is relevant for 20 Gbit/s, the memory needs to be doubled.

Further, memories for a mobile client device, such as a user equipment (UE) can be divided into two categories.

A common memory also called System Memory above is a large memory with relative high latency. The common memory is relatively cheap and is not integrated into the same silicon that contains the functions. In other words, the common memory is an off-chip memory.

A dedicated memory which is small with relatively low latency and a relatively high current consumption. The dedicated memory is very expensive and integrated into the same silicon as the functions of the receiver device. In other words, the dedicated is an on-chip memory.

Below a more detailed description of data transmission between the physical layer and the Layer 2 is described. A real receiver chain is capable of receiving multiple carriers and this is used later to compare memory sizes. For ease of explanation however, the description below describes the data flow of one carrier only. Also, in a real system several transport blocks (TBs) will be received in parallel by use of multiple hybrid automatic repeat request (HARQ) processes on a single carrier. One HARQ is transmitting/receiving in each time unit and the other processes are either waiting for new data or for retransmission to correct transmission error(s). The description below describes the data flow to receive one TB.

Figure 3:
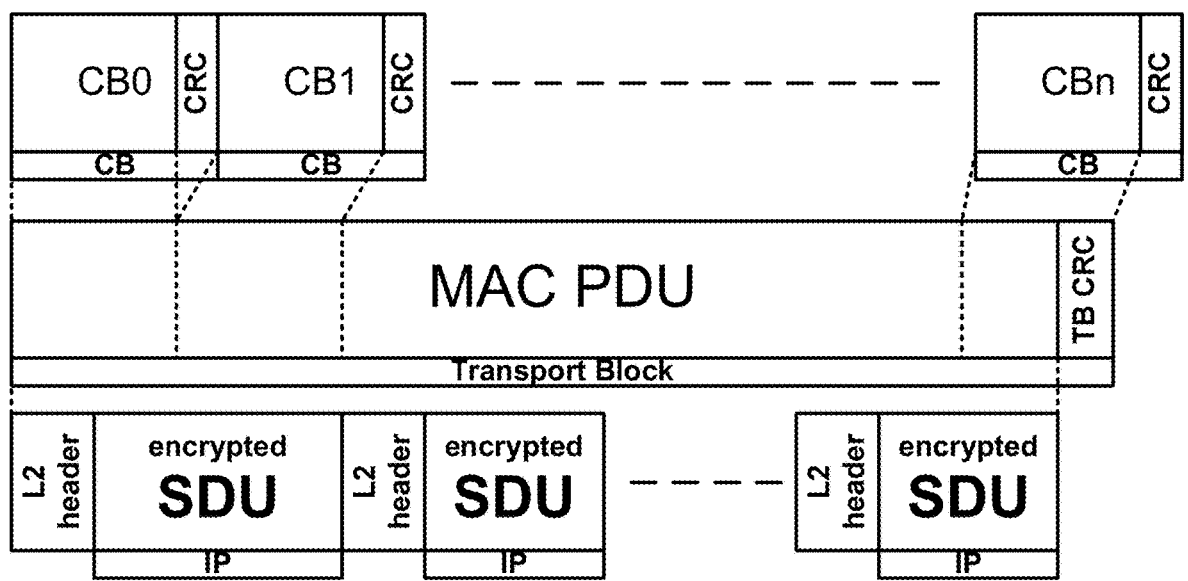
FIG. 3 illustrates the relationship between a Code Block and an IP packet.

The interface between the physical layer and Layer 2 is based on Medium Access Control Protocol Data Unit (MAC PDU). The MAC PDU is received in a Transport Block (TB) by the physical layer. The TB is protected by a Cyclic Redundancy Check (CRC). The MAC PDU contains one or more MAC Service Data Units (SDUs). The SDUs are typically also referred to as payload. Within the MAC SDU are first the Radio Link Control (RLC) and the Packet Data Convergence Protocol (PDCP) sub layer headers and then an Internet protocol (IP) Packet. The IP Packet is encrypted. In FIG. 3, the relationship between a Code Block (CB) and an IP packet is illustrated. In FIG. 3 CB represents the decoded CB, which consists of the payload followed by a CRC. The MAC, RLC and PDCP headers are called L2 headers in FIG. 3.

Figure 4:
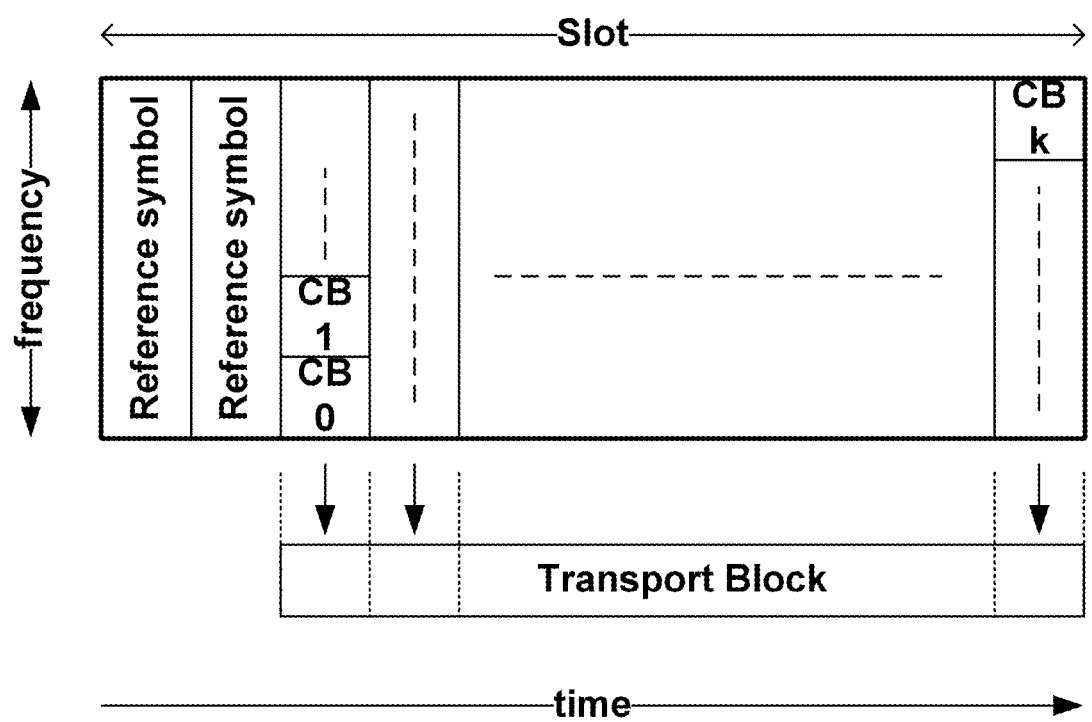
FIG. 4 illustrates a transmission with symbols of the Code Blocks transmitted in the order of the transmitted bits.

The TB is received as a plurality of channel encoded code blocks (CBs) by the physical layer. Each such code block is protected by a CRC. The Code Blocks can therefore be individually decoded by a decoder. Also, each Code Block can be individually re-transmitted when a receiver detects an error in the CRC for a Code Block. The CBs are delivered in slots and a slot is further divided into symbols as is shown in FIG. 4. The CBs are transmitted in symbols such that the first symbol contains CBs related to the bits in the first part of the transport block; the next symbol contains CBs with bits related to the following bits etc. FIG. 4 illustrates such a transmission with symbols of the CBs transmitted in the order of the transmitted bits. Note that this is an example and that other configuration exists. Additional reference symbols may be placed in other symbol(s) than the first symbols in the slot. The transport block may span over more than one slot.

The transmission of one TB can typically be handled by a HARQ process. The HARQ process is responsible for transfer of the CB over the air interface. The receiver will send back Acknowledge (ACK) or not-Acknowledge (NACK) messages to the transmitter to allow transmission of a next TB or retransmission of the current TB. The HARQ process can in e.g. NR request retransmission of individual CB or groups of CBs (CBG). This is a major difference compared to the Long-Term Evolution (LTE) standard which always retransmits the entire TB.

Now, Layer 2 deciphering processing of the received data will be described. Decipher (or Decryption) of the encrypted data is typically done by computing the binary XOR between a ciphering overlay bit stream and the received encrypted data. The output from the XOR operation is the unencrypted data. In the current LTE standard, the ZUC algorithm is used to produce the ciphering overlay bit stream. For each IP packet to decipher, the decryption/ decipher function is initialized with specific parameters, each IP packet has a different parameter. This cipher function (ZUC) produces a 32 bit cipher each tick. As an example, the ciphering function is 'ticked' 375 times to produce a ciphering overlay to decipher one 1500 byte IP packet. For new radio (NR), additional ciphering algorithm functions may be added. A main aspect to be considered in NR is that the cipher is a stream cipher which is generated piece by piece.

For reasons identified above, the receiver circuit embodiment as depicted in FIG. 1 requires a very high bandwidth to a common memory or if the receiver circuit is modified to the embodiment of FIG. 2, a large expensive dedicated memory is required. Both these embodiments would therefore be expensive and difficult to implement for NR.

It is therefore desired to provide a receiver circuit with high bandwidth without adding a large dedicated memory and to provide a receiver circuit that can be used for e.g. NR.

By providing a processing mechanism of the transport block on CB level, the size of the on-chip memory can be reduced. Thus, instead of buffering the complete TB in a dedicated memory before starting Layer 2 processing, the transport block processing is configured to start directly after decoding the first CB of a TB. If no CB CRC errors are received, the processing can continue in parallel with receiving the following symbols with CB until the complete TB has been received. If a CB CRC error is detected then the following correctly received CBs in the TB are buffered in the common off-chip (buffer) memory. Only after the CB which had been previously received with error has been successfully received and delivered to the on-chip FIFO memory, the already correctly decoded subsequent CBs of the TB are fetched from the buffer memory and placed in the correct order in the on-chip FIFO memory. Hence, the code blocks are always delivered in the correct order to the Layer 2 decipher unit. The code blocks in the FIFO-memory are then deciphered in the correct order by the decipher unit.

In parallel with receiving the remaining CBs of the TB in the physical layer, Layer 2 will decipher the received IP packets on-the-fly. In other words, deciphering by Layer 2 will start as soon as the first bit of an IP packet is decoded. In accordance with some embodiments, the buffer between the physical layer and Layer 2 is at least 32*2 bits to process one TB. 32 bits is then primarily selected as a minimum value to have an efficient communication between channel decoder and the buffer. The 32 bits are also selected in order to have enough bits available to apply a complete 32-bit cipher overlay.

Considering up to 8 HARQ processes per carrier each delivering one TB each time and 32 carriers the buffer between the physical layer and Layer 2 is: 32*8*32*2=16384 bits. This would result in a required on-chip memory size that is substantially reduced compared to the embodiment in FIG. 2.

Figure 5:
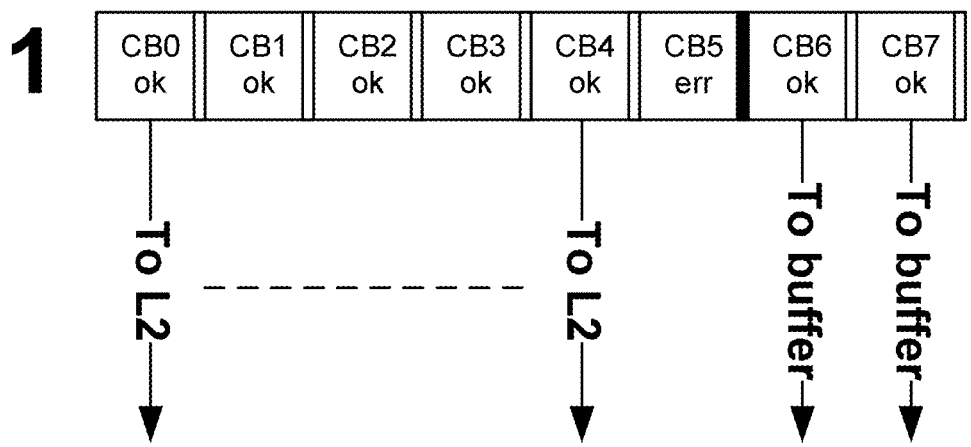
FIG. 5 illustrates reception of one Transport Block carried in 8 Code Blocks.
Figure 5:
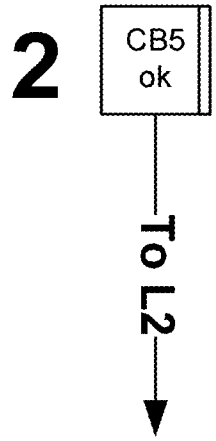
Figure 5:
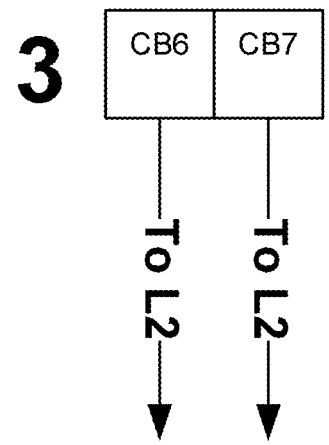

Thus, by providing a receiver circuit that enables starting the decipher processing of the TB already when the first CB has been successfully decoded, an improved receiver circuit can be provided. In such an embodiment, the physical layer delivers CBs to Layer 2 in the same order as they are ordered in the TB. If a CB has a CRC error, the correctly received CBs in that TB are buffered until the CB(s) with error has been successfully received. An example in FIG. 5 shows the reception of one TB carried in 8 CBs (one TB being formed by 8 CBs). In FIG. 5:

1) All CBs are transmitted in a first transmission. CB0 to CB4 are received correctly and are delivered in order to Layer 2. CB5 has a CRC error and cannot be delivered to L2. CB6 and CB7 are received correctly but cannot be delivered to L2 since CB5 is missing. CB6 and CB7 are stored in the off-chip buffer memory.
2) Later on, the CB5 is successfully received (e.g. as a retransmission) and is delivered to L2 by placing into the on-chip FIFO memory.
3) Only after CB5 is placed into the on-chip FIFO memory, the buffered CB6 and CB7 are fetched from the off-chip buffer memory and placed into the on-chip FIFO memory for delivery in order to L2.

Layer 2 processing can be designed to process each TB as a stream of data. The Layer 2 processing can be configured to receive each TB starting with the first bits and process the TB piece by piece. The Layer 2 processing function can then be designed to process only a part of the TB as it is received through a small buffer, such as the FIFO buffer. For each TB being received, the Layer 2 processing can implement a control loop that handles Layer 2 header decoding and deciphering of all SDUs in the TB.

Figure 6:
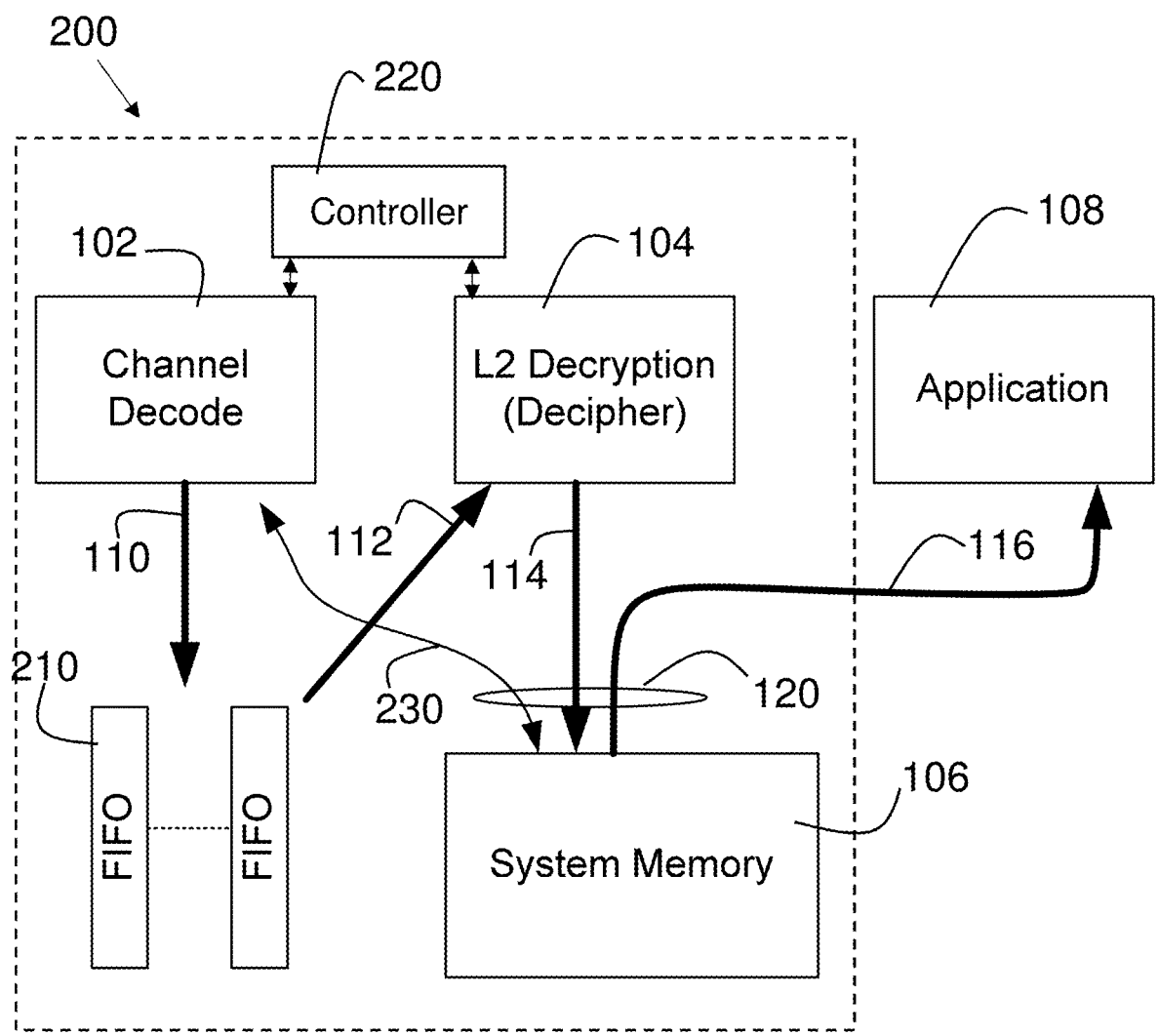
FIG. 6 shows a receiver circuit structure for high data rates.

FIG. 6 shows an example embodiment of such a receiver circuit 200 according to an embodiment of the present application. In FIG. 6, multiple FIFO memories 210 are shown since the Layer 2 can be implemented to receive several TBs is parallel. FIG. 6 also shows an arrow 230 from the decoder 102 to the off-chip buffer memory 106. The decoder individually decodes the code blocks received in a transport block. Here the buffer memory is a part of the overall system memory 106 (e.g. also referred to as common memory), but the buffer memory could also be a separate memory. This arrow 230 represents the data that has to be buffered and cannot be directly delivered to Layer 2. Typically, such data are the CBs of a TB which are received after a not correctly received CB of the TB: For L2 deciphering, a code block which has been buffered in the buffer memory has to be fetched from the buffer memory 106 and placed in the on-chip FIFO memory 210 where it can be retrieved by the decipher unit 104 to be deciphered. The decipher unit 104 therefore always retrieves code blocks to be deciphered from the on-chip FIFO memory 210. Further, a controller 220 is provided. The controller 220 can direct output data (decoded code blocks) from the decoder 102 to the on-chip FIFO memory 210 or to the buffer memory 106 depending on if the output data is in order or not. The controller 220 can also inform the the Layer 2 decipher unit 104 about received transport blocks. Hereby the Layer 2 decipher unit 104 will have knowledge about the received transport block. The controller is for example configured to indicate when there are correctly decoded code blocks ready to decipher in the on-chip FIFO memory 210. When there are multiple on-Chip FIFO memories provided, the controller 220 can be configured to decide which FIFO memory to retrieve decoded code blocks from to decipher by the decipher unit 104. The controller 220 could be implemented in many different ways. Hence, the indication to the Layer 2 decipher unit about the status in the on-chip FIFO memory can in some embodiments be direct and handled by a designated physical entity, but could also be indirect such as the Layer 2 decipher unit detecting that the FIFO memory is running low on data or some other mechanisms controlling the flow can be used. All such mechanisms, both direct and indirect mechanisms, are considered to be covered by the term "controller" as used herein.

The operating point for the HARQ in LTE is 10% probability for error in the first transmission. Since first transmission for a TB in NR is similar to that of LTE the probability for error in first transmission can be assumed to be similar. Considering that the errors in the CBs are evenly distributed over the CBs in a TB it can be assumed that on average 50% of the CBs in a TB have been processed before hitting a CRC error. Thus, arrow 230 can be assumed to represent 10% of the 20 Gbit/s. (2 Gbit/s store+2 Gbit/s load)*50%.

The Layer 2 deciphering is done before verifying the CRC of the transport block. Thus, if a CRC error of the TB is detected or if the HARQ fails to deliver a TB due to maximum number of retransmission, then the output based on the TB being processed is discarded and the FIFO memory 210 is emptied. The Layer 2 sub layer states (RLC/PDCP) are updated when the TB CRC has been successfully verified.

Figure 7:
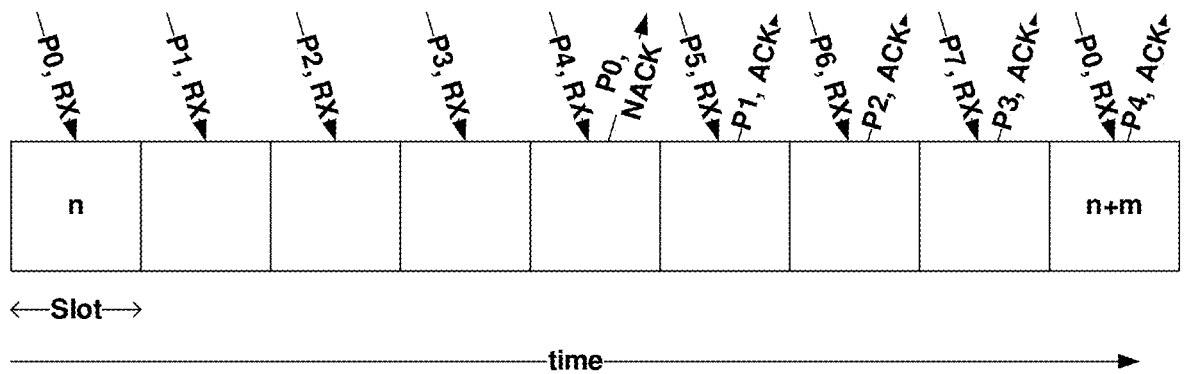
FIG. 7 shows an example of how multiple HARQ process can be used in parallel for one carrier.

FIG. 7 shows one example of how multiple HARQ process can be used in parallel for one carrier. One HARQ process is receiving in each slot. FIG. 7 shows an example with eight HARQ processes (P0 to P7). In FIG. 7, the ACK for P0 is sent four slots after the slot where P0 received data (CB). The illustration in FIG. 7 can be used for computing memory consumption of the receiver circuit as described herein. In this example for calculating the memory, the system has 8 HARQ process. HARQ process P0 receives a first transmission in slot n. In this slot data is sent to Layer 2 though a dedicated TB FIFO memory. If there is an error in this TB the data flow from physical layer to Layer 2 will be halted until the retransmission is received. While waiting for retransmission the other HARQ processes can continue to receive data in respective dedicated TB FIFO memories. In this example, with up to 8 HARQ processes each delivering one TB each time and 32 carriers the buffer between the physical layer and L2 is calculated as: number of carriers <NumCarriers 32>*number of HARQ processes per carrier <NumHarq Per Carrier 8>*buffer size per TB<BufferSize Per TB 32*2>=16384 bits.

The number of supported carriers and the number of HARQ processes/carrier is a capability of the mobile device.

Figure 8:
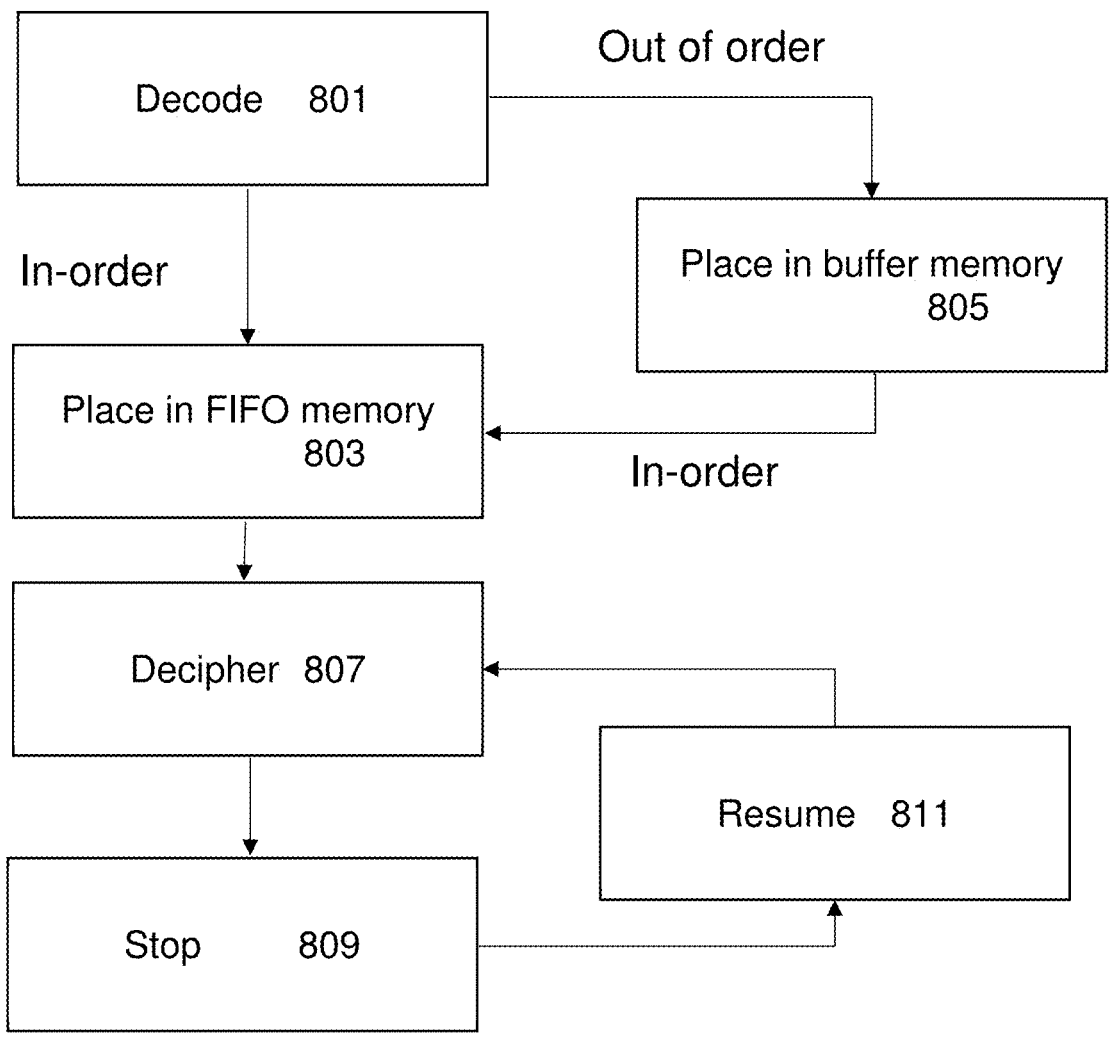
FIG. 8 is a flow chart illustrating operations performed in a receiver circuit.

In FIG. 8, a flow chart illustrating some operations performed in a receiver circuit in accordance with the above are illustrated. It should be understood that several of the following operations may happen in parallel. E.g. one data block may get deciphered at the same time as another data block gets decoded. The receiver circuit is configured to receive data in transport blocks where each transport block comprises a set of individually decodable code blocks. First in a operation 801, a received code block is decoded. If the decoding is incorrect a request for re-transmission is initiated such as by a HARQ process. If the correctly decoded code block of a transport block is in-order, the decoded code block is stored in an on-chip FIFO memory in a operation 803. When a subsequent code block of the transport block is incorrectly decoded, any subsequent correctly decoded code block of the same transport block is out of order and is stored in a buffer memory in a operation 805. For a code block to be in-order thus means that all code blocks before (as seen in the transmission order of the code blocks in the first transmission of a transport block) a particular code block of the same transport block have been successfully decoded. Similarly, Out-of-order means that at least one code block before (as seen in the transmission order of the code blocks in the first transmission of a transport block) a particular code block of the same transport block has not been successfully decoded. The code blocks stored in the buffer memory can then later be retrieved to the FIFO memory when the incorrectly decoded code block has been correctly decoded and a code block stored in the buffer memory is in-order again. Hence, the FIFO memory will always be filled with in-order code blocks. In other words, it is impossible that a later code block of a transport block "overtakes" an earlier code block in the same transport block. The later code blocks of a transport block will always wait in the buffer memory until the earlier previously erroneously received block was received correctly. Only after the now correct earlier code block has been placed in the on-chip FIFO memory, the waiting code blocks will be placed in the on-chip FIFO memory.

Next, the Layer 2 decipher unit performs the sequential deciphering process comprising in an operation 807 sequentially and in a consecutive order receiving the decoded code blocks from the at least one on-chip FIFO memory and deciphering the correctly decoded code blocks in a consecutive order. Because the code blocks are placed in order in the FIFO memory, the decipher unit will only need to take the code blocks stored in order in the FIFO memory one-by-one to perform the deciphering of the code blocks in a consecutive order and in sequence.

When it is indicated by e.g. a controller, that a code block has been incorrectly decoded, the Layer 2 decipher unit stops in operation 809 the sequential deciphering process. The indication may either happen through a physical controller directly indicating or some other control mechanism indirectly indicating such incorrect decoding (e.g. no data coming from the on-chip FIFO memory anymore). When the controller later indicates to the Layer 2 decipher unit that a previously incorrectly decoded code block later has been correctly decoded by the decoder, the sequential deciphering process is continued in operation 811. Then Layer 2 decipher unit continues deciphering the code blocks delivered by the on-chip FIFO memory. The first code block after continuation being the code block which has been previously incorrectly decoded but has now been correctly decoded. Only after then the Layer 2 decipher unit deciphers the code blocks of the same transport block stored in the buffer memory transferred via the on-chip FIFO memory. Hence the deciphering happens sequentially and in a consecutive order. The method can advantageously be implemented by a computer program.

Using the receiver circuit as described herein results in that a number of improvements can be achieved, including:
Smaller on-chip memory would be required.
Less Silicon is needed.
Lower power is required.

Further, latency can be reduced by starting the deciphering processing already at symbol level. In contrast to this, existing deciphering processes used for example for LTE will start decipher only when a complete TB has been received. The receiver circuit as described herein enables start of deciphering already when the first symbol with CBs has been received and decoded.

In particular, the receiver circuit as described herein is suitable for efficient implementation in a mobile client device supporting the NR standard because:
CBs are not interleaved over several symbols. This means that the CBs in one symbol form a contiguous set of bits belonging to the TB being received. If Layer 2 works on CB level then the Layer 2 may be triggered already when the first symbols with the first CB in a TB is successfully decoded.
The Layer 2 headers are interleaved with the MAC SDU in the MAC PDU. The Layer2 MAC PDU processing function can then first process the Layer 2 header and decipher each SDU in the MAC PDU. This means that the Layer 2 does not need to buffer information.

What is claimed is:

1. A receiver circuit comprising:
a decoder for decoding received data, wherein the receiver circuit is configured to receive the received data in transport blocks where each transport block comprises a set of individually decodable code blocks;
at least one on-chip First In First Out (FIFO) memory;
a Layer 2 decipher unit;
a buffer memory; and
a controller;
wherein the decoder is configured to:
store a correctly decoded code block in said at least one on-chip FIFO memory; and
when a code block of a transport block is incorrectly decoded, store any subsequent correctly decoded code block of the same transport block in the buffer memory; and
wherein the Layer 2 decipher unit is configured to in a sequential deciphering process:
sequentially and in a consecutive order receive decoded code blocks from the at least one on-chip FIFO memory and decipher correctly decoded code blocks; and
when the controller indicates to the Layer 2 decipher unit that a code block has been incorrectly decoded by the decoder, stop the sequential deciphering process; and
when the controller indicates to the Layer 2 decipher unit that a previously incorrectly decoded code block later has been correctly decoded by the decoder, continue the sequential deciphering process by deciphering the previously incorrectly decoded code block and by retrieving any code blocks of the same transport block stored in the buffer memory transferred via the at least one on-chip FIFO memory for sequentially deciphering said retrieved code blocks in a consecutive order.

2. The receiver circuit according to claim 1, wherein the decoder is configured to move correctly decoded blocks of a transport block to the at least one on-chip FIFO memory as long as all previous code blocks from the transport block are correctly decoded.

3. The receiver circuit according to claim 1, wherein the receiver circuit is configured to receive the code blocks in a consecutive order.

4. The receiver circuit according to claim 1, wherein the receiver circuit is configured to request re-transmission of an incorrectly decoded code block using a hybrid automatic repeat request (HARQ) process.

5. The receiver circuit according to claim 1, wherein the buffer memory is an off-chip memory.

6. The receiver circuit according to claim 1, wherein multiple on-chip FIFO memories are provided and wherein different parallel received transport blocks are associated with a separate on-chip FIFO memory.

7. The receiver circuit according to claim 6, wherein a configurable number of on-chip FIFO memories are provided.

8. The receiver circuit according to claim 1, wherein the decipher unit is configured to store a deciphered version of a transport block in a system memory of the receiver circuit when all code blocks of the transport block have been deciphered.

9. The receiver circuit according to claim 8, wherein the buffer memory is a part of the system memory.

10. The receiver circuit according to claim 4, wherein the Layer 2 decipher unit is configured to continue deciphering code blocks associated with another HARQ process while waiting for the incorrectly decoded code block to be correctly decoded by the decoder.

11. A method for a receiver circuit comprising:
decoding code blocks, wherein the receiver circuit is configured to receive data in transport blocks where each transport block comprises a set of individually decodable code blocks;
storing a correctly decoded code block in an on-chip First In First Out (FIFO) memory;
when a code block of a transport block is incorrectly decoded, storing any subsequent correctly decoded code block of the same transport block in a buffer memory;
performing a sequential deciphering process comprising:
sequentially and in a consecutive order receiving decoded code blocks from the on-chip FIFO memory and deciphering correctly decoded code blocks in a consecutive order,
upon an indication that a code block has been incorrectly decoded stopping the sequential deciphering process, and
upon an indication that a previously incorrectly decoded code block later has been correctly decoded, continuing the sequential deciphering process by deciphering the previously incorrectly decoded code block and by retrieving any code blocks of the same transport block stored in the buffer memory transferred via the on-chip FIFO memory for sequentially deciphering said retrieved code blocks in a consecutive order.

* * * * *